United States Patent
Pandey et al.

(10) Patent No.: US 12,489,013 B2
(45) Date of Patent: Dec. 2, 2025

(54) SEMICONDUCTOR-ON-INSULATOR FIELD-EFFECT TRANSISTORS INCLUDING STRESS-INDUCING COMPONENTS

(71) Applicant: GlobalFoundries U.S. Inc., Malta, NY (US)

(72) Inventors: Shesh Mani Pandey, Saratoga Springs, NY (US); Rajendran Krishnasamy, Essex Junction, VT (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 363 days.

(21) Appl. No.: 17/935,913

(22) Filed: Sep. 27, 2022

(65) Prior Publication Data
US 2024/0105503 A1    Mar. 28, 2024

(51) Int. Cl.
*H01L 21/762*    (2006.01)
*H10D 30/69*    (2025.01)

(52) U.S. Cl.
CPC ..... *H01L 21/76264* (2013.01); *H10D 30/795* (2025.01)

(58) Field of Classification Search
None
See application file for complete search history.

(56) References Cited

U.S. PATENT DOCUMENTS

| | | | |
|---|---|---|---|
| 7,528,050 B2 | 5/2009 | Holt et al. | |
| 8,502,283 B2 | 8/2013 | Xiang et al. | |
| 9,984,936 B1* | 5/2018 | Xie | H01L 29/66439 |
| 2015/0001652 A1 | 1/2015 | Cai et al. | |
| 2020/0135895 A1 | 4/2020 | Pandey et al. | |
| 2020/0194273 A1* | 6/2020 | Reboh | H01L 21/84 |

* cited by examiner

*Primary Examiner* — Sue A Purvis
*Assistant Examiner* — Carnell Hunter, III
(74) *Attorney, Agent, or Firm* — Francois Pagette

(57) ABSTRACT

A transistor is provided. The transistor includes a substrate, a gate structure, a semiconductor structure, and a dielectric component. The gate structure is over the substrate and the semiconductor structure is adjacent to the gate structure. The semiconductor structure has a first side facing the gate structure and a second side laterally opposite the first side. The dielectric component is in the substrate. The dielectric component has a first portion adjacent to the second side of the semiconductor structure and a second portion under the first portion, wherein the second portion extends under the gate structure.

20 Claims, 5 Drawing Sheets

SEMICONDUCTOR-ON-INSULATOR FIELD-EFFECT TRANSISTORS INCLUDING STRESS-INDUCING COMPONENTS

TECHNICAL FIELD

The present disclosure relates generally to semiconductor devices, and more particularly to semiconductor-on-insulator field-effect transistors including stress-inducing components and methods of forming the same.

BACKGROUND

Semiconductor devices, such as field-effect transistors (FETs), may be built upon a bulk substrate or a composite substrate, such as a semiconductor-on-insulator (SOI) substrate. FETs built upon an SOI substrate may offer several advantages, including lower power consumption and higher device speed.

Further device improvements to the FETs may be achieved by introducing stress to a channel region between a source region and a drain region thereof to increase charge carrier mobility. For example, it may be desirable to induce tensile stress to the channel region of an n-type FET and compressive stress to the channel region of a p-type FET. The designation of "n-type" or "p-type" is dependent upon the type of dopant conductivity in the source region and the drain region of the FET. For example, n-type conductivity dopants may include arsenic, phosphorus, or antimony, and p-type conductivity dopants may include boron, aluminum, or gallium.

In order to meet the growing needs of the semiconductor industry, FETs having yet further device improvements and methods of forming the same are provided.

SUMMARY

To achieve the foregoing and other aspects of the present disclosure, semiconductor-on-insulator field-effect transistors including stress-inducing components and methods of forming the same are presented.

According to an aspect of the present disclosure, a transistor is provided. The transistor includes a substrate, a gate structure, a semiconductor structure, and a dielectric component. The gate structure is over the substrate and the semiconductor structure is adjacent to the gate structure. The semiconductor structure has a first side facing the gate structure and a second side laterally opposite the first side. The dielectric component is in the substrate. The dielectric component has a first portion adjacent to the second side of the semiconductor structure and a second portion under the first portion, wherein the second portion extends under the gate structure.

According to another aspect of the present disclosure, a transistor is provided. The transistor includes a substrate, a gate structure, a first semiconductor structure, a first dielectric component, a second semiconductor structure, and a second dielectric component. The substrate includes an insulator layer and a semiconductor layer over the insulator layer. The gate structure is over the substrate and between the first semiconductor structure and the second semiconductor structure. The first dielectric component and the second dielectric component are in the substrate and at laterally opposite sides of the first semiconductor structure and the second semiconductor structure, respectively, from the gate structure. A portion of the first dielectric component and a portion of the second dielectric component are arranged in the insulator layer of the substrate and extend under the gate structure.

According to yet another aspect of the present disclosure, a method of forming a transistor is provided. The method includes forming a gate structure over a semiconductor layer of a substrate and forming a semiconductor structure adjacent to the gate structure. A dielectric component is formed at least partially in an insulator layer of the substrate that is under the semiconductor layer. A portion of the dielectric component is formed under the gate structure.

BRIEF DESCRIPTION OF THE DRAWINGS

The embodiments of the present disclosure will be better understood from a reading of the following detailed description, taken in conjunction with the accompanying drawings.

Figure 1:
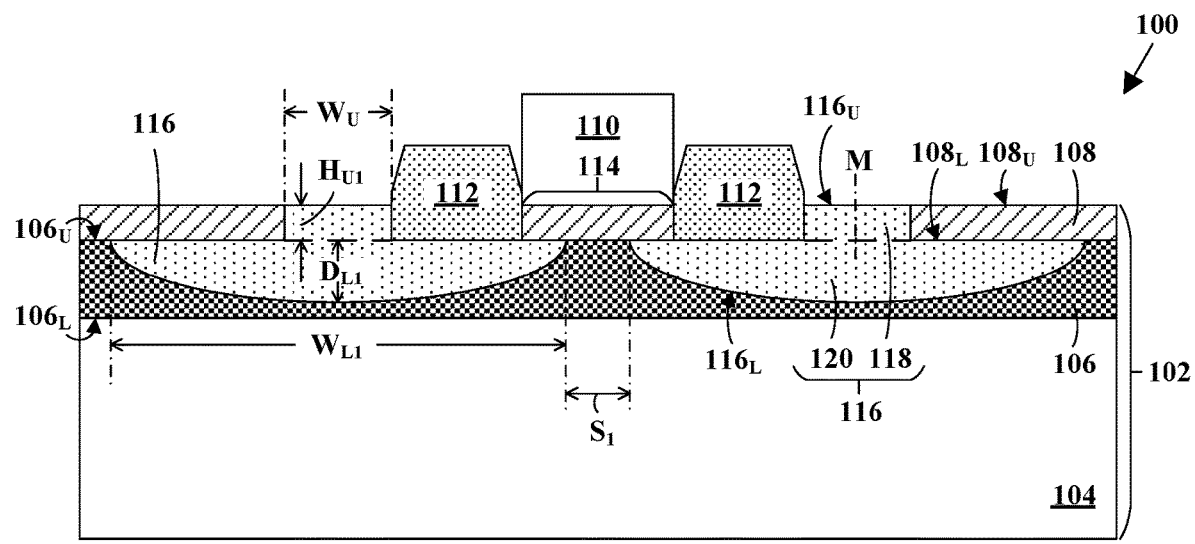
FIG. 1 illustrates a cross-sectional view of a field-effect transistor, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure.

Additionally, features in the drawings are not necessarily drawn to scale. For example, the dimensions of some of the features in the drawings may be exaggerated relative to other features to help improve the understanding of the embodiments of the device. The same reference numerals in different drawings denote the same features, while similar reference numerals may, but do not necessarily, denote similar features.

DETAILED DESCRIPTION

The present disclosure relates to semiconductor-on-insulator field-effect transistors including stress-inducing components and methods of forming the same. Various embodiments of the present disclosure are now described in detail with accompanying drawings. It is noted that like and corresponding features are referred to by the use of the same reference numerals. The embodiments disclosed herein are exemplary, and not intended to be exhaustive or limiting to the disclosure.

Figure 2:
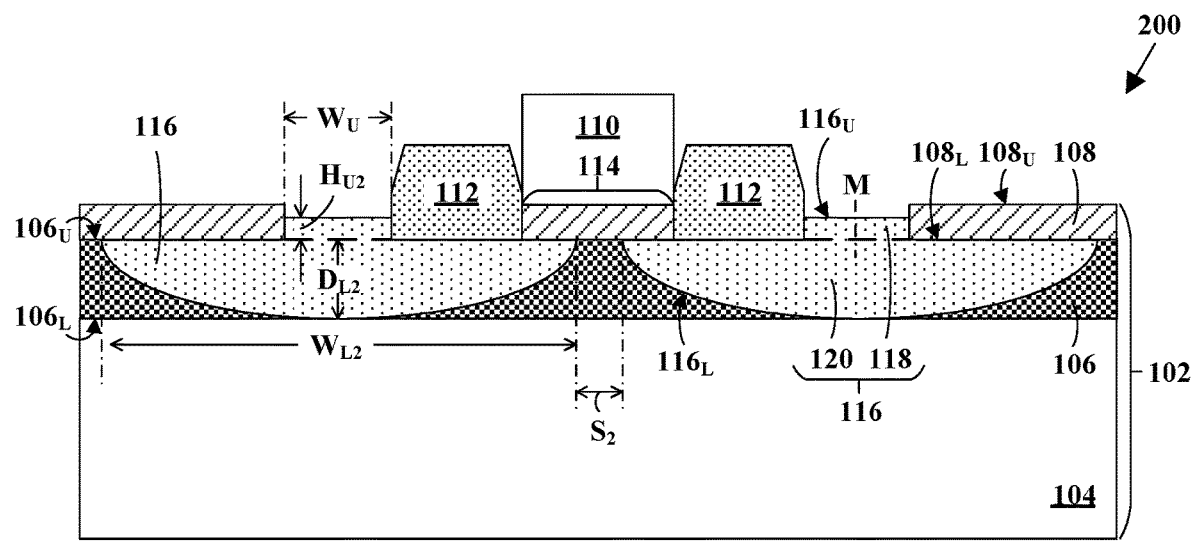
FIG. 2 illustrates a cross-sectional view of a field-effect transistor, according to an alternative embodiment of the disclosure.

FIG. 1 illustrates a cross-sectional view of a field-effect transistor (FET) 100 and FIG. 2 illustrates a cross-sectional view of a FET 200, according to various embodiments of the disclosure. The FET 100 and the FET 200 may be similar to each other, and thus common features are labeled with the same reference numerals and need not be separately discussed.

Referring to FIG. 1, the FET 100 may be arranged in and over a substrate 102. The FET 100 may be an n-type FET or a p-type FET. The substrate 102 may include a composite substrate, such as a semiconductor-on-insulator (SOI) substrate having a bulk layer 104, an insulator layer 106 over the bulk layer 104, and a semiconductor layer 108 over the insulator layer 106.

The bulk layer 104 may include a semiconductor material or a non-semiconductor material. Examples of a semiconductor material may include silicon, silicon germanium, silicon carbide, or other II-VI or III-V semiconductor compounds. Examples of a non-semiconductor material may include glass or ceramic.

The insulator layer 106 may serve to at least electrically isolate the semiconductor layer 108 from the bulk layer 104. The insulator layer 106 may include a dielectric material, including silicon dioxide, and may also be referred to as a buried oxide (BOX) layer.

The semiconductor layer 108 may include a monocrystalline semiconductor material, for example, silicon, silicon germanium, silicon carbide, or other II-VI or III-V semiconductor compounds. The semiconductor material of the semiconductor layer 108 may be doped or undoped. The semiconductor layer 108 may also be referred to as a device layer or an active layer of the FET 100. The semiconductor layer 108 may or may not include the same material as the bulk layer 104.

The FET 100 may further include a gate structure 110 and a pair of semiconductor structures 112 arranged at laterally opposite sides of the gate structure 110. The gate structure 110 may be arranged over the semiconductor layer 108. The gate structure 110 is simplistically illustrated in FIG. 1 and may include a gate dielectric layer, one or more conductive layers over the gate dielectric layer that serves to function as a gate electrode, and gate spacers over laterally opposite sidewalls of the gate electrode (not separately shown).

The semiconductor structures 112 may be arranged laterally adjacent to the gate structure 110 and may serve as a source region or a drain region of the FET 100. The size and shape of the semiconductor structures 112 may be dependent upon the type of application intended for the FET 100. For example, the semiconductor structures 112 may be raised structures each having a height that extends over an upper surface $108_U$ of the semiconductor layer 108.

The semiconductor structures 112 may be at least partially arranged in the semiconductor layer 108. For example, as illustrated in FIGS. 1 and 2, the semiconductor structures 112 may extend through the semiconductor layer 108 and a discrete portion of the semiconductor layer 108 may be arranged therebetween and directly under the gate structure 110. Even though not illustrated in the accompanying drawings, the semiconductor structures 112 may not extend through the semiconductor layer 108 in another embodiment of the disclosure, and a portion of the semiconductor layer 108 may be further arranged under the semiconductor structures 112.

The portion of the semiconductor layer 108 under the gate structure 110 may define a channel region 114 of the FET 100. In an embodiment of the disclosure, the semiconductor structures 112 may induce a desired stress to the channel region 114 of the FET 100 from laterally opposite sides thereof. For example, depending on the type of FET, the semiconductor structures 112 may induce tensile stress to the channel region 114 for an n-type FET or compressive stress for a p-type FET.

The semiconductor structures 112 may include a semiconductor material, for example, silicon, silicon phosphorous, silicon phosphorous carbide, germanium, gallium arsenide, gallium nitride, aluminum gallium indium phosphide, or combinations thereof. In an embodiment of the disclosure, the semiconductor structures 112 may include epitaxially-grown silicon for an n-type FET. In another embodiment of the disclosure, the semiconductor structures 112 may include epitaxially-grown silicon germanium for a p-type FET.

The FET 100 may yet further include a dielectric component 116 at a laterally opposite side of each semiconductor structure 112 from the gate structure 110. The dielectric component 116 may have an upper portion 118 and a lower portion 120 directly under the upper portion 118; the transition of the lower portion 120 to the upper portion 118 is diagrammatically shown by a dashed line for purposes of illustration. The transition of the lower portion 120 to the upper portion 118 of the dielectric component 116 may be at a plane substantially coplanar with a lower surface $108_L$ of the semiconductor layer 108. In an embodiment of the disclosure, the dielectric component 116 may serve to induce stress to neighboring features, for example, to the adjacent semiconductor structure 112 and the insulator layer 106 proximate to the dielectric component 116. The dielectric component 116 may include a strained dielectric material under compressive strain or a tensile strain, for example, silicon nitride, silicon dioxide, silicon carbide, or silicon germanium.

The dielectric component 116 may include an uppermost surface $116_U$ that terminates the upper portion 118 thereof and a lower surface $116_L$ that terminates the lower portion 120 thereof. In an embodiment of the disclosure, the uppermost surface $116_U$ of the dielectric component 116 may be substantially planar. In another embodiment of the disclosure, the lower surface $116_L$ of the dielectric component 116 may be curved and have a convex profile.

The upper portion 118 of the dielectric component 116 may be arranged immediately adjacent to the semiconductor structure 112, for example, the upper portion 118 of the dielectric component 116 may be laterally between the semiconductor structure 112 and a portion of the semiconductor layer 108. The upper portion 118 of the dielectric component 116 may also be laterally arranged between portions of the semiconductor layer 108, even though this embodiment is not illustrated in the accompanying drawings.

The upper portion 118 of the dielectric component 116 may include a width $W_U$ and a height $H_{U1}$ above the upper surface $106_U$ of the insulator layer 106. The upper portion 118 of the dielectric component 116 may be at least partially arranged through the semiconductor layer 108. For example, as illustrated in FIG. 1, the upper portion 118 of the dielectric component 116 may extend through the semiconductor layer 108. In an embodiment of the disclosure, the uppermost surface $116_U$ of the dielectric component 116 may be substantially coplanar with the upper surface $108_U$ of the semiconductor layer 108 and the height $H_U$ of the upper portion 118 of the dielectric component 116 may be substantially equal to the thickness of the semiconductor layer 108.

Even though not illustrated in the accompanying drawings, the uppermost surface $116_U$ of the dielectric component 116 may be arranged over the upper surface $108_U$ of the semiconductor layer 108 and the height $H_{U1}$ of the upper portion 118 of the dielectric component 116 may be greater than the thickness of the semiconductor layer 108, according to an embodiment of the disclosure.

Alternatively, as illustrated in FIG. 2, the upper portion 118 of the dielectric component 116 may be partially arranged through the semiconductor layer 108. The uppermost surface $116_U$ of the dielectric component 116 may be under the upper surface $108_U$ of the semiconductor layer 108 and the height Hua of the upper portion 118 of the dielectric component 116 may be lesser than the thickness of the semiconductor layer 108. In this embodiment of the disclosure, the height Hua of the dielectric component 116 in the FET 200 may be shorter than the height $H_{U1}$ of the dielectric component 116 in the FET 100.

Referring back to FIG. 1, the lower portion 120 of the dielectric component 116 may be partially arranged in the insulator layer 106 with a maximum depth $D_{L1}$ under the upper surface $106_U$ of the insulator layer 106. The maximum depth $D_{L1}$ may be shallower than the thickness of the insulator layer 106, and a portion of the insulator layer 106 may separate the dielectric component 116 from the bulk layer 104. Alternatively, as illustrated in FIG. 2, the lower portion 120 of the dielectric component 116 may be arranged in the insulator layer 106 with a maximum depth $D_{L2}$ that extends through the insulator layer 106 and directly contact the bulk layer 104. Accordingly, the maximum depth $D_{L2}$ is deeper than the maximum depth $D_{L1}$. In this embodiment of the disclosure, the maximum depth $D_{L2}$ of the FET 200 may be substantially equal to the thickness of the insulator layer 106.

The lower portion 120 of the dielectric component 116 may also extend symmetrically over laterally opposite sides of the upper portion 118. For example, the lower portion 120 of the dielectric component 116 may have mirror symmetry about an axis M through the center of the upper portion 118 of the dielectric component 116. As illustrated in FIG. 1, the lower portion 120 of the dielectric component 116 may include a maximum width $W_{L1}$, and the maximum width $W_{L1}$ may be wider than the width $W_U$ of the upper portion 118. Similarly illustrated in FIG. 2, the lower portion 120 of the dielectric component 116 may include a maximum width $W_{L2}$, and the maximum width $W_{L2}$ may be wider than the width $W_U$ of the upper portion 118. Accordingly, the maximum width $W_{L2}$ of the dielectric component 116 of the FET 200 is wider than the maximum width $W_{L1}$ of the dielectric component 116 of the FET 100.

The lower portion 120 of the dielectric component 116 may further extend under a portion of the gate structure 110 and an outermost portion of the lower portion 120 may be arranged directly under the gate structure 110. Specifically, the outermost portion of the lower portion 120 may be in direct contact with the channel region 114. The outermost portion of the lower portion 120 may induce a desired stress to the channel region 114 from the bottom thereof. The stress induced to the channel region 114 may be a similar type, i.e., tensile stress or compressive stress, as the semiconductor structures 112, though not necessarily in the same magnitude.

The dielectric components 116 may be spaced apart from each other by a portion of the insulator layer 106 directly under the gate structure 110. For example, as illustrated in FIG. 1, the dielectric components 116 may be spaced apart from each other by a spacing $S_1$ vertically under the gate structure 110. In another example, as illustrated in FIG. 2, the dielectric components 116 may be spaced apart from each other by a spacing $S_2$ vertically under the gate structure 110, and the spacing $S_2$ is narrower than the spacing $S_1$. In an embodiment of the disclosure, the spacings $S_1$ and $S_2$ between the dielectric components 116 may be about 5 nanometers (nm) to about 10 nm therebetween from their respective maximum widths $WL_1$ and $WL_2$, respectively.

Figure 3:
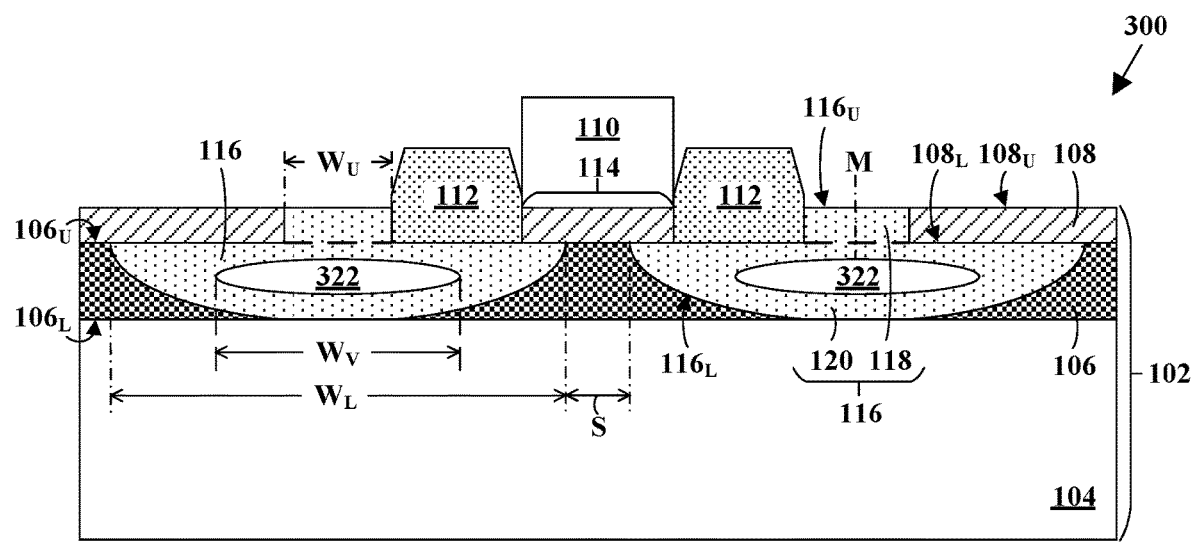
FIG. 3 illustrates a cross-sectional view of a field-effect transistor, according to yet another embodiment of the disclosure.

FIG. 3 is a cross-sectional view of a FET 300, according to yet another embodiment of the disclosure. The FET 300 is similar to the FET 200 in FIG. 2, and thus common features are labeled with the same reference numerals and need not be separately discussed.

The FET 300 may also include dielectric components 116 arranged at laterally opposite sides of the gate structure 110. The dielectric components 116 may be similar to the dielectric components 116 of the FET 100 in FIG. 1 and the FET 200 in FIG. 2 but may each further include a void 322 therewithin. The void 322 may be entirely within the dielectric component 116, i.e., the void 322 may be collectively surrounded by the dielectric component 116 from above, under, and laterally, which fully seals the void 322.

The void 322 may be filled with air and may be referred to as an air gap. The void 322 may contain a gas at or near atmospheric pressure, or at sub-atmospheric pressure, for example, a partial vacuum. The elemental composition of the gas in the void 322 can include different gases and should not be construed as having any particular elemental composition, for example, any number and type of gases may be present in the void 322 as defined by the dielectric component 116. In an embodiment of the disclosure, the void 322 may be fully sealed within the lower portion 120 of the dielectric component 116 and has a maximum width $W_V$ wider than the width $W_U$ of the upper portion 118 of the dielectric component 116. In another embodiment of the disclosure, the void 322 may be arranged under the semiconductor layer 108 of the substrate 102 and includes end portions that are arranged directly under the semiconductor structures 112.

Figure 4A:
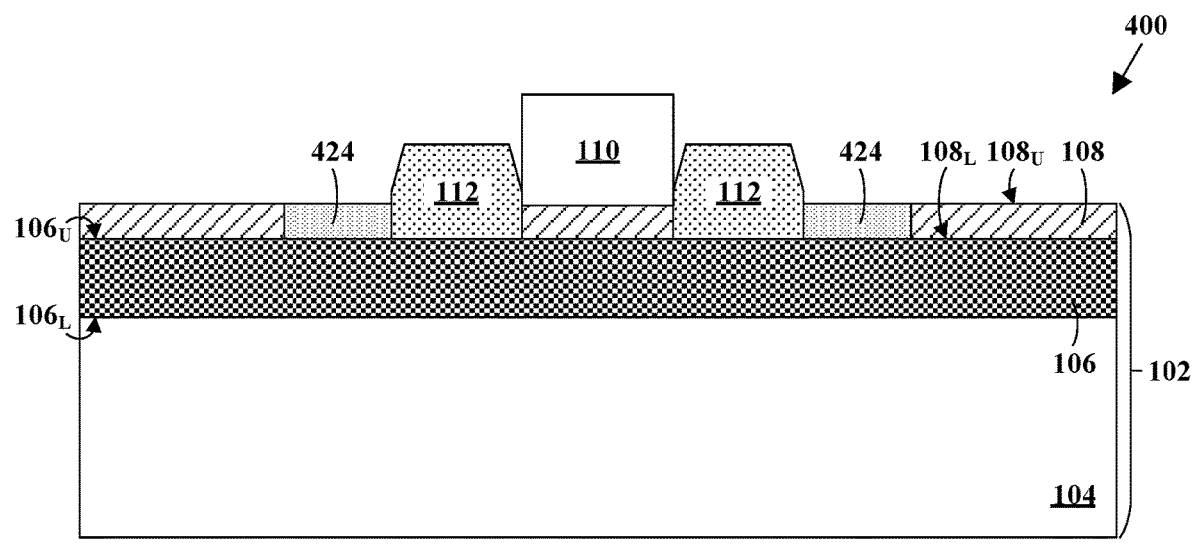
FIGS. 4A and 4B are cross-sectional views of a field-effect transistor, illustrating a method of forming a stress-inducing component thereof, according to an embodiment of the disclosure.
Figure 4B:
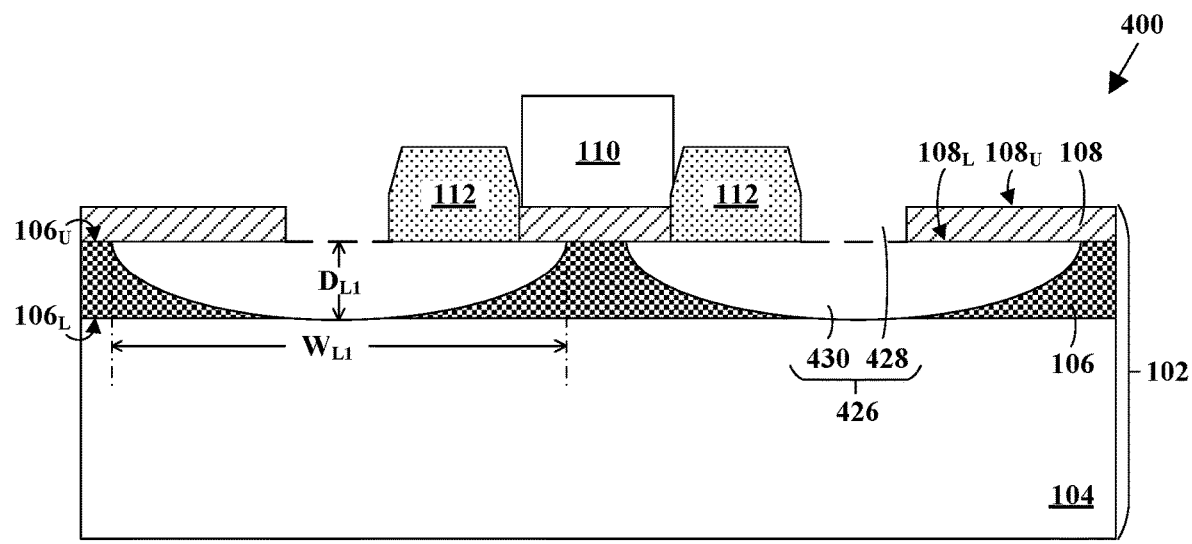

FIGS. 4A and 4B are cross-sectional views of a FET 400, illustrating a method of forming a dielectric component thereof, according to an embodiment of the disclosure. The FET 400 is similar to the FET 200 in FIG. 2, and thus common features are labeled with the same reference numerals and need not be separately discussed. Certain structures may be conventionally fabricated, for example, using known processes and techniques, and specifically disclosed processes and methods may be used to achieve individual aspects of the present disclosure.

FIG. 4A illustrates the FET 400 at an initial fabrication stage of a processing method, according to an embodiment of the disclosure. The FET 400 may be an n-type FET or a p-type FET. The FET 400 may be arranged in and over a composite substrate 102 having a bulk layer 104, an insulator layer 106 over the bulk layer 104, and a semiconductor layer 108 over the insulator layer 106. The FET 400 may include a gate structure 110, a pair of semiconductor structures 112 arranged at laterally opposite sides of the gate structure 110, and isolation structures 424 in the semiconductor layer 108. The isolation structures 424 may be arranged at laterally opposite sides of the semiconductor structures 112 from the gate structure 110. The isolation structures 424 may be arranged through the semiconductor layer 108 and may be referred to as shallow trench isolation (STI) structures. In an embodiment of the disclosure, the isolation structures 424 may include a dielectric material, such as silicon dioxide.

FIG. 4B is a cross-sectional view of FET 400 at a fabrication stage subsequent to FIG. 4A, according to an embodiment of the disclosure. An opening 426 may be formed at least partially in the insulator layer 106 through each of the isolation structures 424. The openings 426 may extend through the semiconductor layer 108.

The openings 426 may be formed using a multi-directional material removal technique, including an isotropic etching process. The isolation structures 424 and the insulator layer 106 underlying thereof may be removed at a higher etch rate than the semiconductor layer 108 and/or the bulk layer 104. The semiconductor layer 108 and/or the bulk layer 104 may remain substantially intact during the multi-directional material removal technique.

The openings 426 may be of any physical size and shape, and the size and shape of the openings 426 may vary depending upon the particular application. For example, as illustrated in FIG. 4B, the openings 426 may include an upper portion 428 and a lower portion 430. The upper portion 428 of the opening 426 may be at the location of the now-removed isolation structure 424, and the lower portion 430 of the opening 426 may be at least partially within the insulator layer 106. Even though FIG. 4B illustrates the openings 426 to be in direct contact with the bulk layer 104, i.e., a portion of the bulk layer 104 may be exposed in the openings 426, the openings 426 may be spaced apart from the bulk layer 104, leaving a portion of the insulator layer 106 between the opening 426 and the bulk layer 104, similar to FIG. 1.

The lower portions 430 of the openings 426 may have a generally convex lower surface with a maximum depth $D_L$ under the upper surface $106_U$ of the insulator layer 106 and a maximum width $W_L$. The maximum width $W_L$ of the openings 426 may be preferably wide enough such that an outermost region of the openings 426 may extend under at least a portion of the gate structure 110. The maximum width $W_L$ may be carefully controlled through process optimization. For example, the isotropic etching process may include a horizontal direction component and a vertical direction component. By subjecting the FET 400 to a relatively longer etching process duration, the openings 426 may acquire a wider maximum width $W_L$, and the outermost regions of the openings 426 may further extend under the gate structure 110. An even longer etching process duration may even merge the openings 426 under the gate structure 110, and the base of the lower portions 430 of the openings 426 may be generally planar rather than a generally convex lower surface. The vertical direction component of the isotropic etching process may be limited by the thickness of the insulator layer 106. For example, due to the selectivity of the etching process, the maximum depth $D_L$ of the opening 426 may not exceed the thickness of the insulator layer 106.

Processing continues with the formation of dielectric components in the openings 426, similar to the dielectric components 116 in FIG. 2. The dielectric components may be formed in the openings 426 by depositing a strained dielectric material using a deposition technique, including a CVD process. The CVD process may be a thermal deposition process or a plasma-enhanced deposition process. The dielectric components may be formed in such a manner that a desired stress may be induced on a channel region of the FET 400 from the bottom thereof, i.e., compressive stress for a p-type FET or tensile stress for an n-type FET. In an embodiment of the disclosure, the strained dielectric material of the dielectric components may include silicon nitride, silicon dioxide, silicon carbide, or silicon germanium.

The strained dielectric material may be deposited to significantly fill the openings 426. For example, the strained dielectric material may be deposited to at least fill the lower portions 430 of the openings 426 such that the strained dielectric material may at least reach the upper surface $106_U$ of the insulator layer 106, similar to the dielectric components 116 in FIG. 1. The strained dielectric material may be further deposited such that the strained dielectric material may reach an upper surface $108_U$ of the semiconductor layer 108, similar to the dielectric components 116 in FIG. 2. A protective layer, such as a layer of photoresist, may be formed over areas of the FET 400 that do not desire to have the strained dielectric material deposited thereupon.

FIGS. 5A through 5D are cross-sectional views of a FET 500, illustrating an alternative method of forming a dielectric component 116 thereof, according to an embodiment of the disclosure. The FET 500 is similar to the FET 200 in FIG. 2, and thus common features are labeled with the same reference numerals and need not be separately discussed.

Figure 5A:
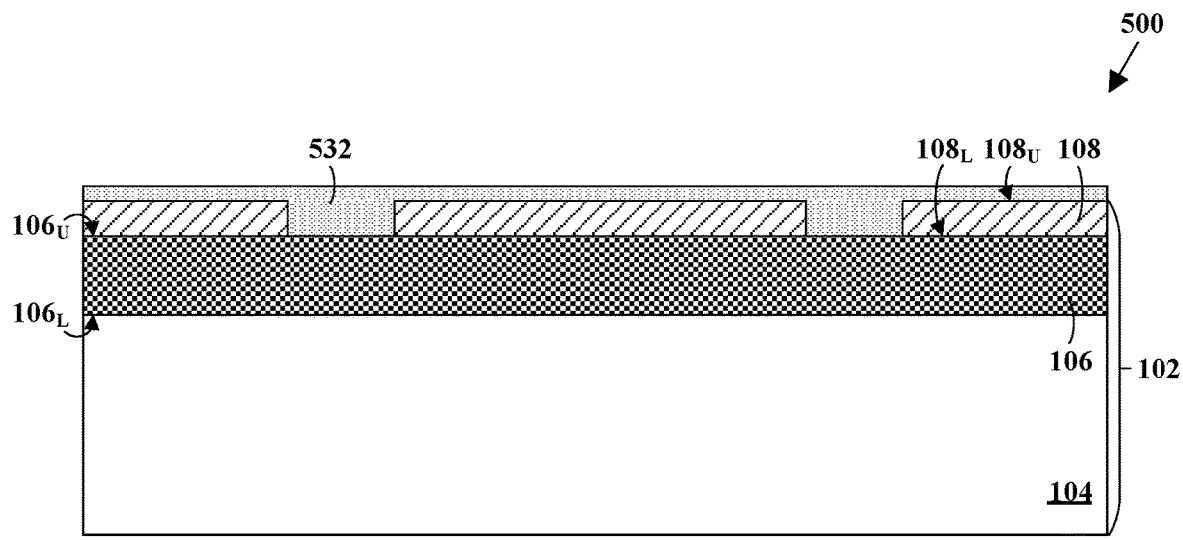
FIGS. 5A through 5D are cross-sectional views of a field-effect transistor, illustrating an alternative method of forming a stress-inducing component thereof, according to an embodiment of the disclosure.

FIG. 5A illustrates the FET 500 at an initial fabrication stage of a processing method, according to an embodiment of the disclosure. A composite substrate 102, such as a semiconductor-on-insulator (all) substrate, may be provided. The substrate 102 may include a bulk layer 104, an insulator layer 106 over the bulk layer 104, and a semiconductor layer 108 over the insulator layer 106.

Openings (not shown) may be formed in the semiconductor layer 108 using a patterning technique, including lithography and etching processes. A portion of the insulator layer 106 may be exposed in the openings. A dielectric isolation material 532 may be deposited to at least fill the openings using a deposition technique, including a CVD process. As illustrated in FIG. 5A, the dielectric isolation material 532 may overfill the openings, and a portion of the dielectric isolation material 532 overlies the semiconductor layer 108. In an embodiment of the disclosure, the dielectric isolation material 532 may include a dielectric material substantially similar to the insulator layer 106, for example, silicon dioxide.

Figure 5B:
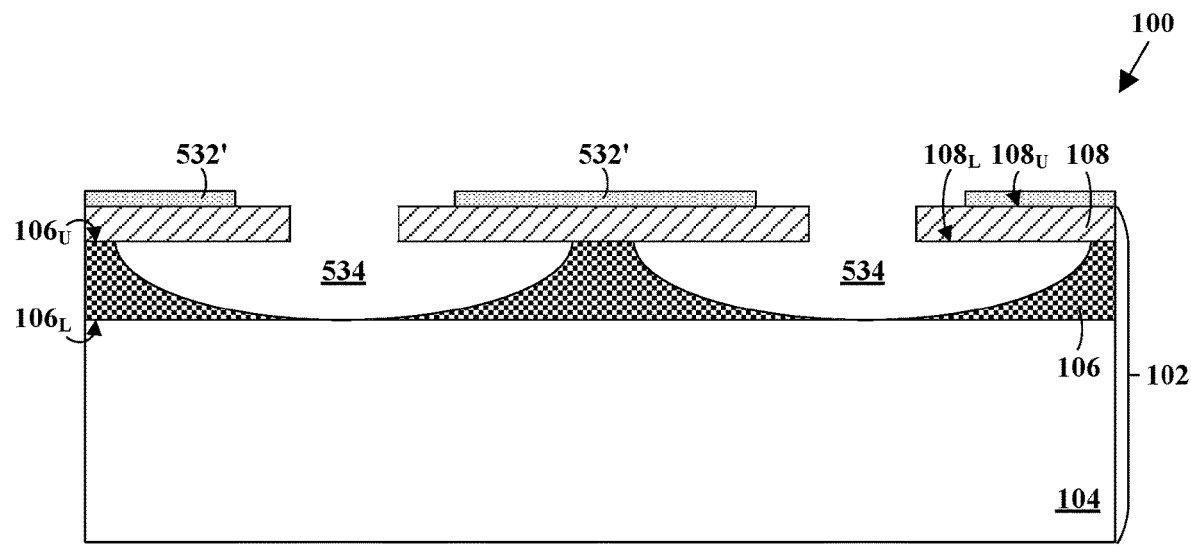

FIG. 5B is a cross-sectional view of FET 500 at a fabrication stage subsequent to FIG. 5A, according to an embodiment of the disclosure. An opening 534 may be formed in the insulator layer 106 through each of the openings, now filled with the dielectric isolation material 532, in the semiconductor layer 108. The openings 534 may be synonymous with the openings 426 in FIG. 4B. The openings 534 may be formed using a patterning technique, including lithography and etching processes.

During the lithography process, mask patterns may be formed on the dielectric isolation material 532 and expose portions of the dielectric isolation material 532. The exposed portions of the dielectric isolation material 532 may be over the now-filled openings in the semiconductor layer 108. Portions of the surrounding semiconductor layer 108 may also be exposed in the mask patterns to minimize potential misalignment of the mask patterns over the now-filled openings in the semiconductor layer 108.

The etching process may be multi-directional and may remove the exposed portions of the dielectric isolation material 532 and portions of the insulator layer 106 underlying thereof. The dielectric isolation material 532 and the insulator layer 106 may be removed at a higher etch rate than the semiconductor layer 108 and/or the bulk layer 104. The semiconductor layer 108 and/or the bulk layer 104 may remain substantially intact during the etching process. A portion of the dielectric isolation material 532' may remain over the semiconductor layer 108. In an embodiment of the disclosure, the etching process is an isotropic etching process.

Figure 5C:
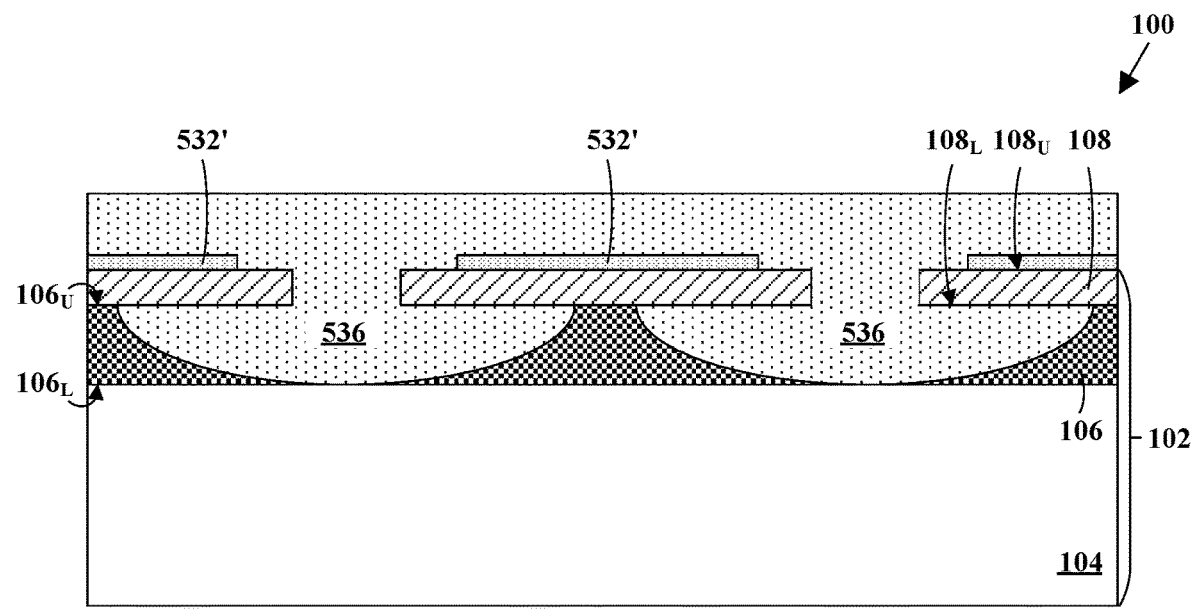

FIG. 5C is a cross-sectional view of FET 500 at a fabrication stage subsequent to FIG. 5B, according to an embodiment of the disclosure. A strained dielectric material 536 may be deposited to at least fill the openings 534. For example, the strained dielectric material 536 may be deposited to overfill the openings 534, and a portion of the strained dielectric material 536 may overlie the remaining portions of the dielectric isolation material 532'. During the deposition of the strained dielectric material 536, a void (not shown)

may be potentially formed within the strained dielectric material 536, similar to the void 322 in FIG. 3. The strained dielectric material 536 may be deposited using a deposition technique, including a CVD process. The CVD process may be a thermal deposition process or a plasma-enhanced deposition process. In an embodiment of the disclosure, the strained dielectric material 536 may include silicon nitride, silicon dioxide, silicon carbide, or silicon germanium.

Figure 5D:
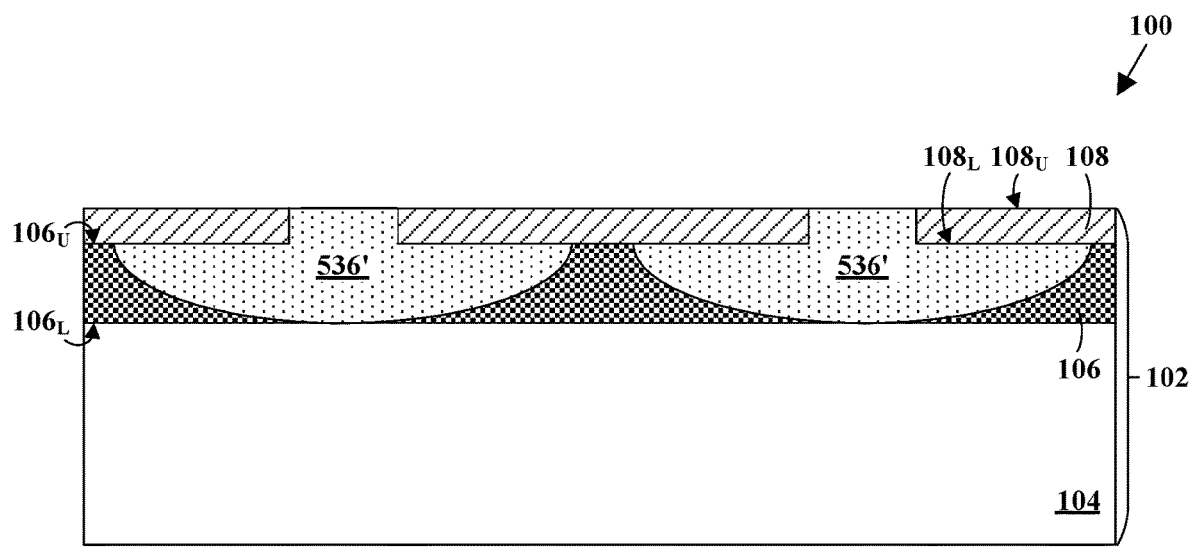

FIG. 5D is a cross-sectional view of FET 500 at a fabrication stage subsequent to FIG. 5C, according to an embodiment of the disclosure. The strained dielectric material 536 may be recessed to form dielectric components 536' in the openings 534. For example, the strained dielectric material 536 may be recessed until an upper surface thereof is substantially coplanar with an upper surface $108_U$ of the semiconductor layer 108. The strained dielectric material 536 may be recessed by a material removal technique, including an etching process, a chemical-mechanical planarization process, or a grinding process. The material removal technique may also remove the remaining dielectric isolation material 532' from the upper surface $108_U$ of the semiconductor layer 108.

Processing continues with the formation of the remaining features of the FET 500, including a gate structure and a pair of semiconductor structures, similar to the gate structure 110 and the pair of semiconductor structures 112 in FIG. 2.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about," or "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. A transistor, comprising:
   a substrate comprising:
      an insulator layer; and
      a semiconductor layer over the insulator layer;
   a gate structure over the substrate, the gate structure having a first side and a second side laterally opposite the first side;
   a first semiconductor structure adjacent to the first side of the gate structure;
   a first dielectric component in the substrate laterally adjacent to and at a laterally opposite side of the first semiconductor structure from the gate structure;
   a second semiconductor structure adjacent to the second side of the gate structure and laterally spaced apart from the first semiconductor structure; and
   a second dielectric component in the substrate laterally adjacent to and at a laterally opposite side of the second semiconductor structure from the gate structure, wherein a lower portion of the first dielectric component and a lower portion of the second dielectric component are arranged in the insulator layer of the substrate and extend under the gate structure, and wherein the first dielectric component and the second dielectric component each comprises a curved convex lower surface.

2. The transistor of claim 1, wherein the first dielectric component and the second dielectric component comprise a strained dielectric material.

3. The transistor of claim 1, wherein the first dielectric component is spaced apart from the second dielectric component by a portion of the insulator layer under the gate structure.

4. The transistor of claim 1, wherein the first dielectric component and the second dielectric component each comprises an uppermost surface that is substantially planar.

5. The transistor of claim 4, wherein the semiconductor layer of the substrate comprises an upper surface, and the upper surface of the semiconductor layer is substantially coplanar with the uppermost surface of the first dielectric component.

6. The transistor of claim 4, wherein the semiconductor layer of the substrate comprises an upper surface, and the upper surface of the semiconductor layer is over the uppermost surface of the first dielectric component.

7. The transistor of claim 1, further comprising a void under the semiconductor layer of the substrate in the first dielectric component.

8. The transistor of claim 7, wherein the void comprises an end portion under the first semiconductor structure.

9. The transistor of claim 1, wherein the substrate further comprising a bulk layer under the insulator layer, and the lower portion of the first dielectric component is over and in direct contact with the bulk layer of the substrate.

10. The transistor of claim 1, wherein the first dielectric component comprises an upper portion over the lower portion, and the upper portion of the first dielectric component is at least partially through the semiconductor layer of the substrate.

11. The transistor of claim 1, wherein the lower portion of the first dielectric component laterally extends symmetrically beyond laterally opposite sides of the upper portion.

12. The transistor of claim 11, wherein the upper portion of the first dielectric component is immediately adjacent to the first semiconductor structure.

13. A transistor, comprising:
a substrate comprising:
an insulator layer; and
a semiconductor layer over the insulator layer;
a gate structure over the substrate, the gate structure having a first side and a second side laterally opposite the first side;
a first semiconductor structure adjacent to the first side of the gate structure;
a first dielectric component in the substrate laterally adjacent to and at a laterally opposite side of the first semiconductor structure from the gate structure;
a second semiconductor structure adjacent to the second side of the gate structure and laterally spaced apart from the first semiconductor structure;
a second dielectric component in the substrate laterally adjacent to and at a laterally opposite side of the second semiconductor structure from the gate structure, wherein a lower portion of the first dielectric component and a lower portion of the second dielectric component are arranged in the insulator layer of the substrate and extend under the gate structure; and
a void under the semiconductor layer of the substrate in the first dielectric component.

14. The transistor of claim 13, wherein the void comprises an end portion under the first semiconductor structure.

15. The transistor of claim 13, wherein the first dielectric component and the second dielectric component each comprises a curved convex lower surface.

16. The transistor of claim 13, wherein the first dielectric component further comprises an upper portion over the lower portion, and the lower portion of the first dielectric component laterally extends symmetrically beyond laterally opposite sides of the upper portion.

17. A transistor, comprising:
a substrate comprising:
an insulator layer; and
a semiconductor layer over the insulator layer, the semiconductor layer comprises an upper surface;
a gate structure over the substrate, the gate structure having a first side and a second side laterally opposite the first side;
a first semiconductor structure adjacent to the first side of the gate structure;
a first dielectric component in the substrate laterally adjacent to and at a laterally opposite side of the first semiconductor structure from the gate structure;
a second semiconductor structure adjacent to the second side of the gate structure and laterally spaced apart from the first semiconductor structure; and
a second dielectric component in the substrate laterally adjacent to and at a laterally opposite side of the second semiconductor structure from the gate structure, wherein a lower portion of the first dielectric component and a lower portion of the second dielectric component are arranged in the insulator layer of the substrate and extend under the gate structure, and wherein the first dielectric component and the second dielectric component each comprises an uppermost surface that is substantially planar and the upper surface of the semiconductor layer is over the uppermost surface of the first dielectric component.

18. The transistor of claim 17, wherein the first dielectric component and the second dielectric component each comprises a curved convex lower surface.

19. The transistor of claim 17, further comprising a void under the semiconductor layer of the substrate in the first dielectric component.

20. The transistor of claim 19, wherein the void comprises an end portion under the first semiconductor structure.

* * * * *